US006333254B1

United States Patent
Abbott et al.

(10) Patent No.: US 6,333,254 B1
(45) Date of Patent: Dec. 25, 2001

(54) METHODS OF FORMING A LOCAL INTERCONNECT METHOD OF FABRICATING INTEGRATED CIRCUITRY COMPRISING AN SRAM CELL HAVING A LOCAL INTERCONNECT AND HAVING CIRCUITRY PERIPHERAL TO THE SRAM CELL AND METHOD OF FORMING CONTACT PLUGS

(75) Inventors: Todd R. Abbott; Michael P. Violette, both of Boise, ID (US); Charles H. Dennison, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/737,919

(22) Filed: Dec. 14, 2000

(51) Int. Cl.[7] .................................................. H01L 21/4763
(52) U.S. Cl. ........................................................... 438/618
(58) Field of Search ........................ 438/618, 620, 438/621, 622, 625, 626, 627, 653

(56) References Cited

U.S. PATENT DOCUMENTS

| | | | |
|---|---|---|---|
| 5,055,427 | * 10/1991 | Hasket ................................. | 437/203 |
| 5,283,203 | * 2/1994 | Gill et al. .............................. | 437/34 |
| 5,489,546 | * 2/1996 | Ahmad et al. ......................... | 437/57 |
| 5,571,733 | * 11/1996 | Wu et al. ............................... | 437/34 |
| 5,665,629 | * 9/1997 | Chen et al. ............................ | 438/384 |
| 6,100,185 | 8/2000 | Hu .......................................... | 438/642 |
| 6,121,129 | * 9/2000 | Greco et al. ........................... | 438/622 |
| 6,223,432 | * 5/2001 | Dennison et al. ..................... | 29/846 |

* cited by examiner

Primary Examiner—David Nelms
Assistant Examiner—Quoz Hwang
(74) Attorney, Agent, or Firm—Wells, St. John, Roberts, Gregory & Matkin, P.S.

(57) ABSTRACT

In one implementation, a substrate is provided which has at least two nodes to be electrically connected. A first conductivity type semiconductive material is formed over and in electrical connection with one of the nodes. A conductive diffusion barrier material is formed over and in electrical connection with the first conductivity type semiconductive material. A second conductivity type semiconductive material is formed over and in electrical connection with the first conductivity type semiconductive material through the conductive diffusion barrier material, and over and in electrical connection with another of the nodes. The first conductivity type semiconductive material, the conductive diffusion barrier material and the second conductivity type semiconductive material are formed into a local interconnect electrically connecting the one node and the another node. Local interconnects fabricated by this and other methods are also contemplated. The invention includes in one implementation a method of forming contact plugs.

35 Claims, 9 Drawing Sheets

FIG. 1

METHODS OF FORMING A LOCAL INTERCONNECT METHOD OF FABRICATING INTEGRATED CIRCUITRY COMPRISING AN SRAM CELL HAVING A LOCAL INTERCONNECT AND HAVING CIRCUITRY PERIPHERAL TO THE SRAM CELL AND METHOD OF FORMING CONTACT PLUGS

TECHNICAL FIELD

This invention relates to local interconnects and SRAM local interconnects including methods of manufacture thereof, and to methods of fabricating integrated circuitry comprising an SRAM cell having a local interconnect and having circuitry peripheral to the SRAM cell, and to methods of forming contact plugs, including by way of example only in embedded memory, SRAM peripheral circuitry, DRAM cell and peripheral circuitry, and logic circuitry.

BACKGROUND OF THE INVENTION

The reduction in memory cell and other circuit size in high density dynamic random access memories (DRAMs) and other circuitry is a continuing goal in semiconductor fabrication. Implementing electric circuits involves connecting isolated devices through specific electric paths. When fabricating silicon and other semiconductive materials into integrated circuits, conductive devices built into semiconductive substrates typically need to be isolated from one another. Such isolation typically occurs in the form of either trench and refill field isolation regions or LOCOS grown field oxide.

Conductive lines, for example transistor gate lines, are formed over bulk semiconductor substrates. Some lines run globally over large areas of the semiconductor substrate. Others are much shorter and associated with very small portions of the integrated circuitry. Traditional local interconnects are formed using processing which includes chemical mechanical polishing of tungsten or other metals, and silicide processing. This invention was principally motivated in making processing improvements in the fabrication of local interconnects, and particularly in the fabrication of SRAM circuitry local interconnects and embedded technologies, although the invention is not so limited.

SUMMARY

The invention includes local interconnects and SRAM local interconnects including methods of manufacture thereof, and methods of fabricating integrated circuitry comprising an SRAM cell having a local interconnect and having circuitry peripheral to the SRAM cell, and methods of forming contact plugs. In one implementation, a substrate is provided which has at least two nodes to be electrically connected. A first conductivity type semiconductive material is formed over and in electrical connection with one of the nodes. A conductive diffusion barrier material is formed over and in electrical connection with the first conductivity type semiconductive material. A second conductivity type semiconductive material is formed over and in electrical connection with the first conductivity type semiconductive material through the conductive diffusion barrier material, and over and in electrical connection with another of the nodes. The first conductivity type semiconductive material, the conductive diffusion barrier material, and the second conductivity type semiconductive material are formed into a local interconnect electrically connecting the one node and the another node. Local interconnects fabricated by this and other methods within and beyond this document are also contemplated.

In one implementation, a method of forming contact plugs includes providing a substrate having a plurality of first conductivity type nodes and a plurality of second conductivity type nodes. An insulative layer is provided over the substrate. First contact openings are formed through the insulative layer to the first conductivity type nodes. A first conductivity type semiconductive material is formed within the first contact openings in electrical connection with the first conductivity type nodes. Second contact openings are formed through the insulative layer to the second conductivity type nodes. A conductive diffusion barrier material is formed within the second contact openings in electrical connection with the second conductivity type nodes and in electrical connection with the first conductivity type semiconductive material received within the first contact openings. A second conductivity type semiconductive material is formed within the second contact openings in electrical connection with the second conductivity type nodes through the conductive diffusion barrier material, and over and in electrical connection with the first conductivity type semiconductive material through the conductive diffusion barrier material within the first contact openings over the first conductivity type nodes.

BRIEF DESCRIPTION OF THE DRAWINGS

Preferred embodiments of the invention are described below with reference to the following accompanying drawings.

FIG. 4 is a view of the FIG. 3 wafer fragment at a processing step subsequent to that depicted by FIG. 3.

FIG. 13 is a view of the FIG. 12 wafer fragment at a processing step subsequent to that depicted by FIG. 12.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
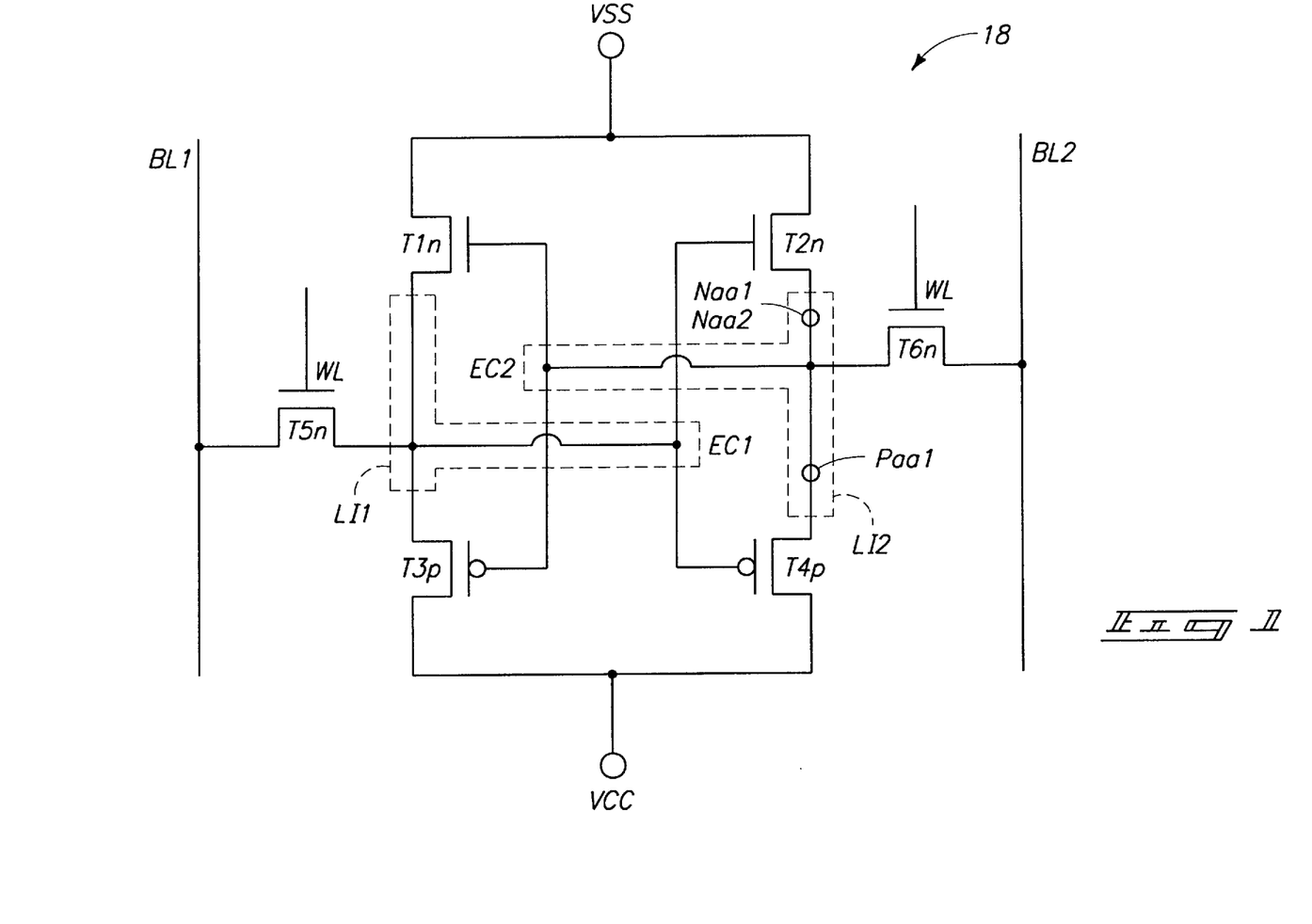
FIG. 1 is a schematic view of an SRAM cell in accordance with an aspect of the invention.
Figure 2:
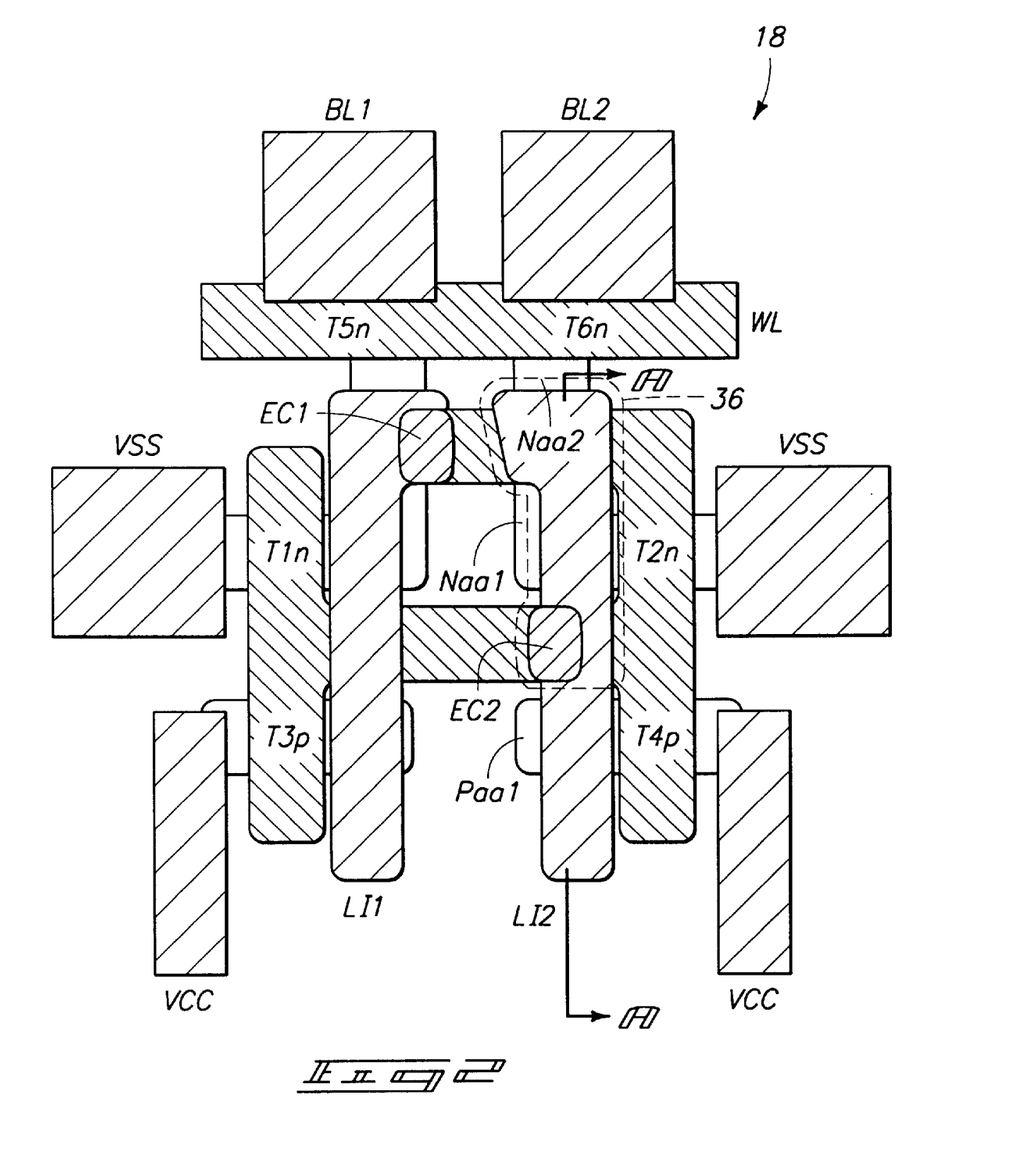
FIG. 2 is a diagrammatic top plan view of one implementation of circuitry layout of the FIG. 1 schematic on a semiconductor wafer fragment.
Figure 3E:
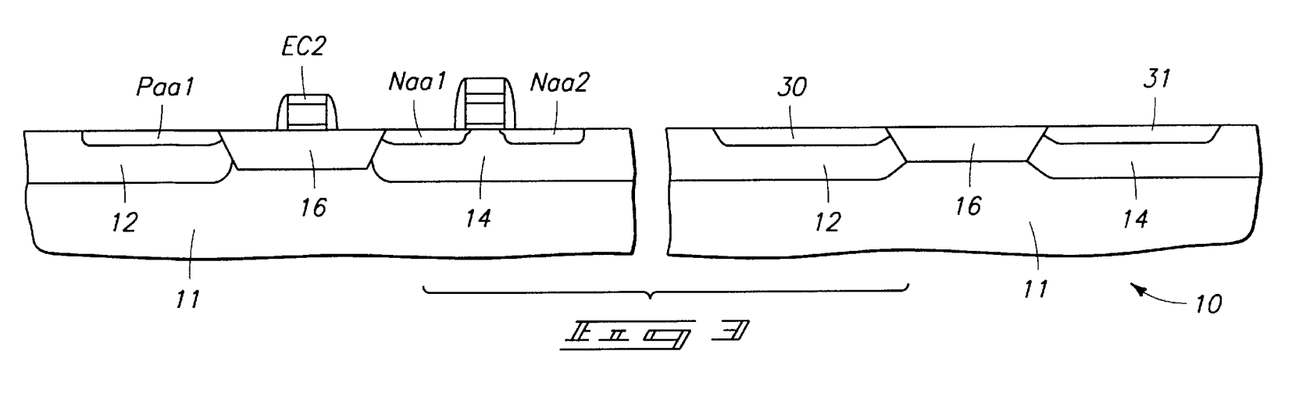
FIG. 3 is a diagrammatic fragmentary sectional view of a semiconductor wafer fragment at one processing step in accordance with but one aspect of the invention, and towards fabrication of the FIG. 2 circuitry layout.
Figure 3F:
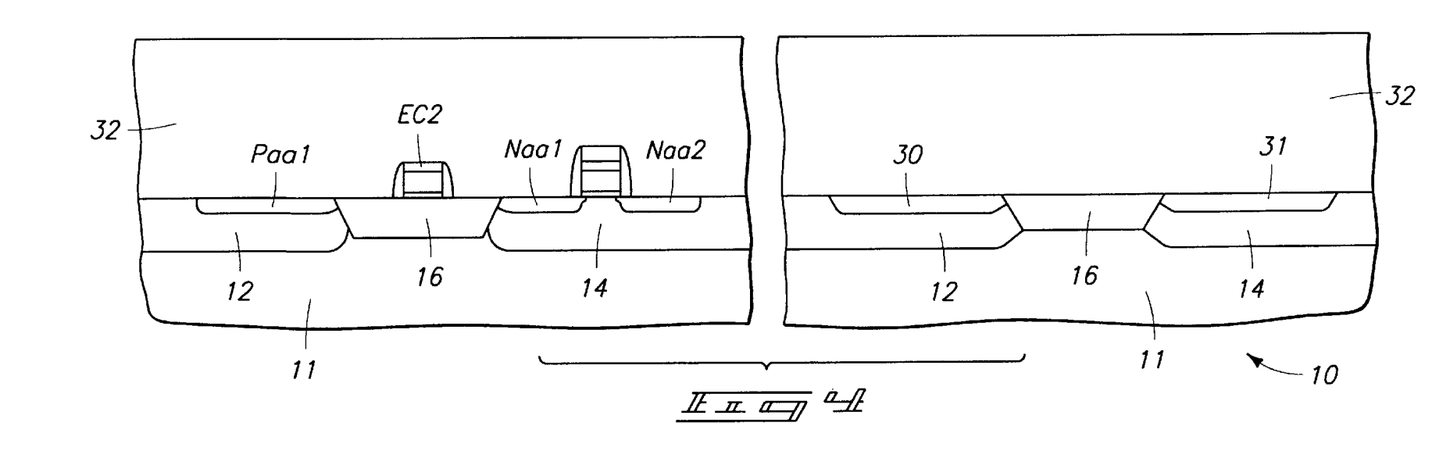

The invention is shown and described with respect to but one preferred embodiment in fabrication of integrated circuitry comprising an SRAM cell having a local interconnect and having circuitry peripheral to the SRAM cell. The invention is of course not so limited. Referring initially to FIGS. 1–3, a semiconductor wafer fragment is indicated generally with reference numeral 10, including a bulk monocrystalline silicon substrate 11. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural. Substrate 10 comprises n-well regions 12 and p-well regions 14, and shallow trench oxide isolation regions 16 therebetween (FIG. 3). The left illustrated portion of FIG. 3 comprises that portion within which the circuitry of FIGS. 1 and 2 is being fabricated, the positional section cut in FIG. 3 largely corresponding to line A—A in FIG. 2. The right illustrated portion of FIG. 3 will comprise circuitry peripheral to that of the SRAM cell or embedded DRAM or other array being fabricated.

Integrated circuitry in accordance with one embodiment of the present invention comprises a static read/write memory cell 18 such as is typically used in high-density SRAMs and embedded DRAM/SRAM memories. A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one. Our U.S. Pat. No. 6,100,185 listing Jeff Yongjun Hu as the inventor, and which issued on Aug. 8, 2000, describes exemplary SRAM circuitry operation and design, and is hereby incorporated by reference. Such shows complementary circuit components and nodes to the Vcc, Vss, B11, B12, WL, T1n, T2n, T3p, T4p, T5n, T6n, LI1, LI2, Naa1, Naa2, Paa1, EC1 and EC2 components and nodes shown herein. The preferred left illustrated gate extension over region 16 has an exposed illustrated silicide region, while the right illustrated gate extension is capped with an insulative material, in the illustrated cross section.

Substrate 10 can be considered as having at least first, second and third nodes of an SRAM cell to be electrically interconnected. For example, Naa1 is a source/drain region of a first conductivity type, here n-type, of a first transistor T2n of the SRAM cell. EC2 can be considered as a second node of the SRAM cell constituting a gate of a second transistor, for example either T1n or T3p. Source/drain region Paa1 can be considered as a third node which is a source/drain region of a second conductivity type, here p-type, of a third transistor T4p of the SRAM cell. Naa2 constitutes another node which will be electrically interconnected in the depicted cross-section of what will constitute local interconnect LI2. Substrate 10 also includes a plurality of peripheral circuitry first conductivity type nodes and a plurality of peripheral circuitry second conductivity type nodes, with one first conductivity type node 30 and one second conductivity type node 31 being illustrated in the right portion of FIG. 3. Accordingly, in the depicted embodiment, nodes Naa1, Naa2 and Paa1 comprise conductively doped semiconductive material regions, with Paa1 being of different conductivity type than Naa1 and Naa2.

Referring to FIG. 4, an insulative layer 32 is provided over the substrate. Such preferably comprises an oxide material, such as borophosphosilicate glass, deposited and planarized to an exemplary thickness of about 8,000 Angstroms.

Figure 5:
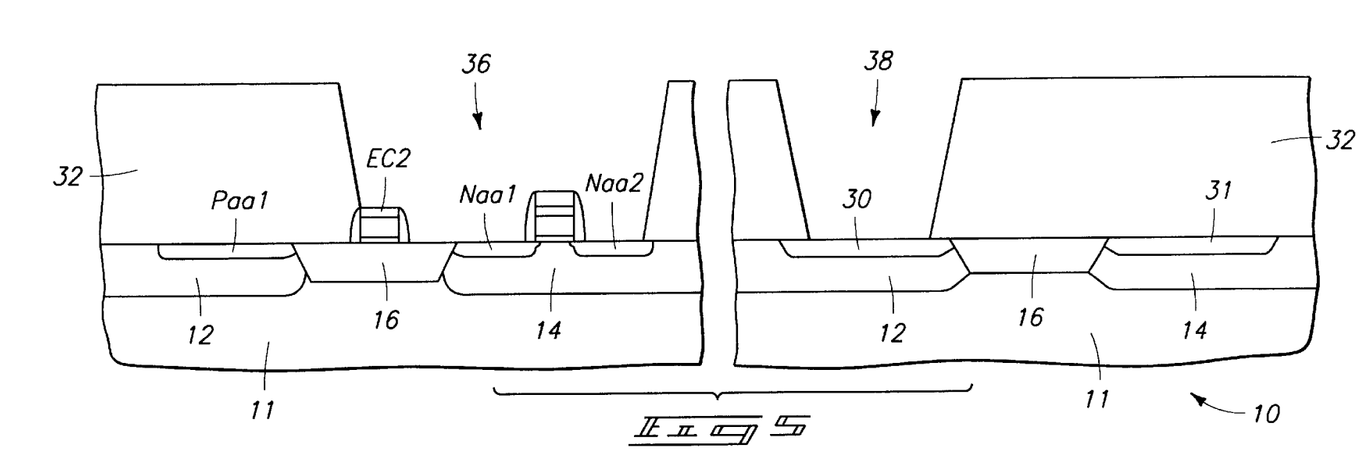
FIG. 5 is a view of the FIG. 3 wafer fragment at a processing step subsequent to that depicted by FIG. 4.

Referring to FIG. 5, and in a first common masking step, a first local interconnect opening 36 is formed into insulative layer 32 to nodes EC2, Naa1 and Naa2; and first contact openings 38 are formed to peripheral circuitry first conductivity type nodes 30. Such processing is preferably conducted by a photoresist masking step followed by anisotropic dry etching of insulating material 32. Referring to FIGS. 2 and 5, first local interconnect opening 36 has an outline which forms only a portion of a total outline of the local interconnect LI2 being fabricated in the illustrated depictions. The dashed outline 36 has been enlarged in FIG. 2 for clarity of illustration.

Figure 6:
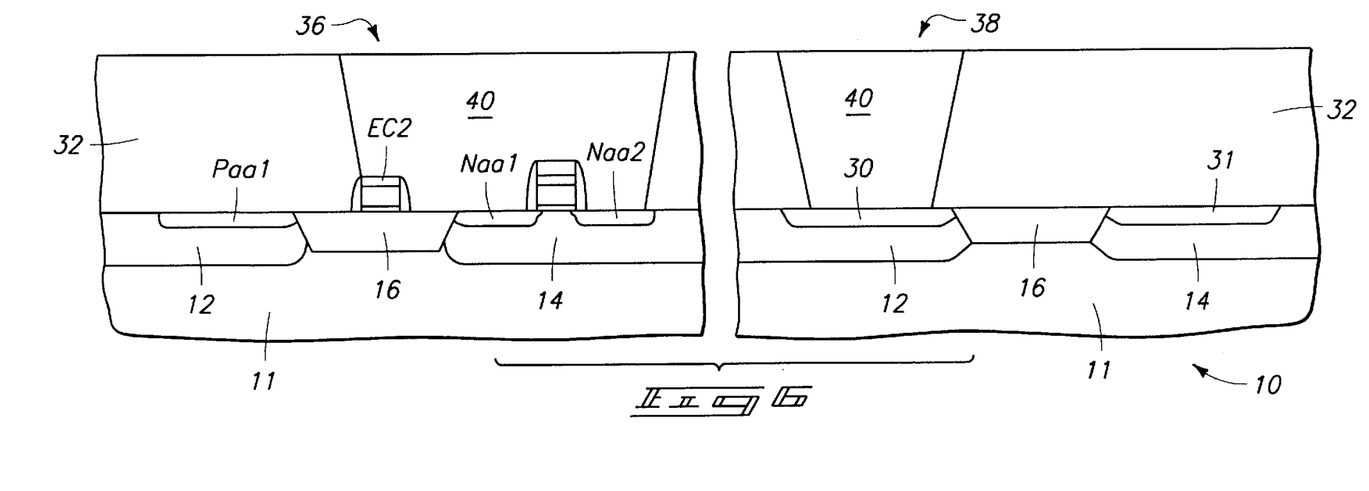
FIG. 6 is a view of the FIG. 3 wafer fragment at a processing step subsequent to that depicted by FIG. 5.

Referring to FIG. 6, first conductivity type semiconductive material 40 is formed within first local interconnect opening 36 in electrical connection with nodes EC2, Naa1 and Naa2, and within peripheral circuitry first contact openings 38 in electrical connection with peripheral circuitry first conductivity type nodes 30. An example and preferred material in the depicted embodiment is in situ n-type conductively doped polysilicon deposited by chemical vapor deposition and planarized back by chemical-mechanical polishing, or other techniques. Other previously deposited intervening conductive layer materials might also be provided, but are not necessarily preferred. The invention also contemplates in certain claimed embodiments that the first conductive material 40 is not necessarily conductively doped semiconductive material, with (by way of example only) metals and metal compounds being contemplated in some of the accompanying claims where "conductive material" is recited. Where first conductivity type semiconductive material is utilized as the conductive material, the above and depicted processing to this point provides but one example of forming a first conductivity type semiconductive material over and in electrical connection with any one of the depicted nodes EC2, Naa1 and Naa2. Any alternate processing is contemplated in accordance with the literal wording of the respective claims and without interpretive or other reference to the specification.

Figure 7:
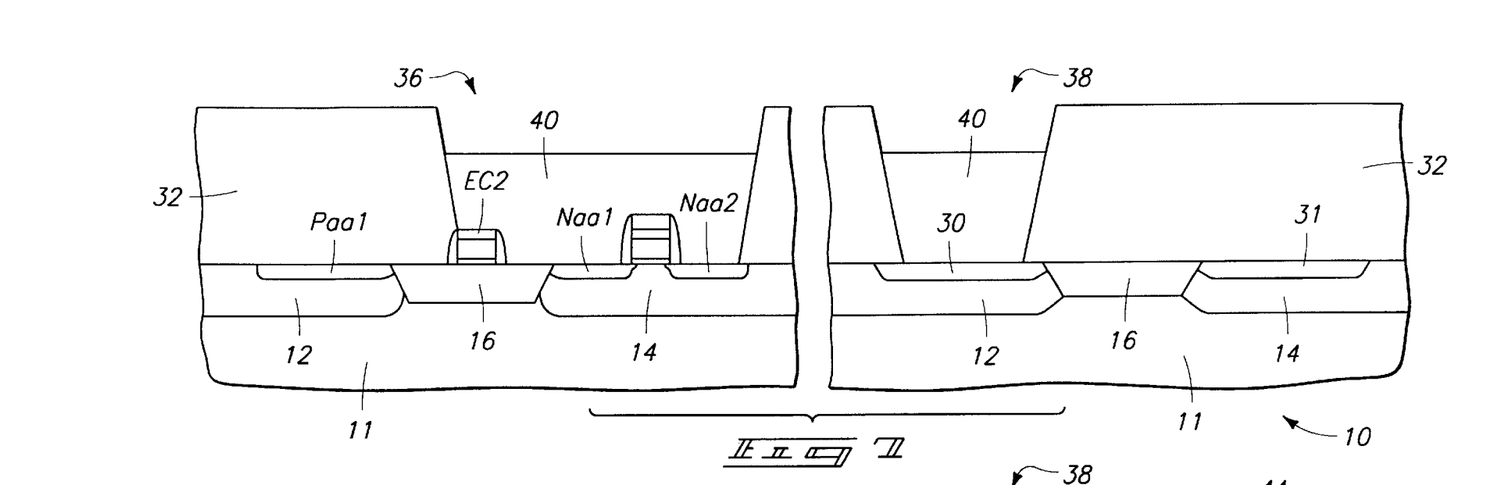
FIG. 7 is a view of the FIG. 3 wafer fragment at a processing step subsequent to that depicted by FIG. 6.

Referring to FIG. 7, first conductivity material 40 is recessed within first local interconnect opening 36 and within first contact openings 38. Such recessing preferably is conducted by chemical etching and in a manner substantially selective to insulative material 32. An exemplary recess depth is about 3,000 Angstroms.

Figure 8:
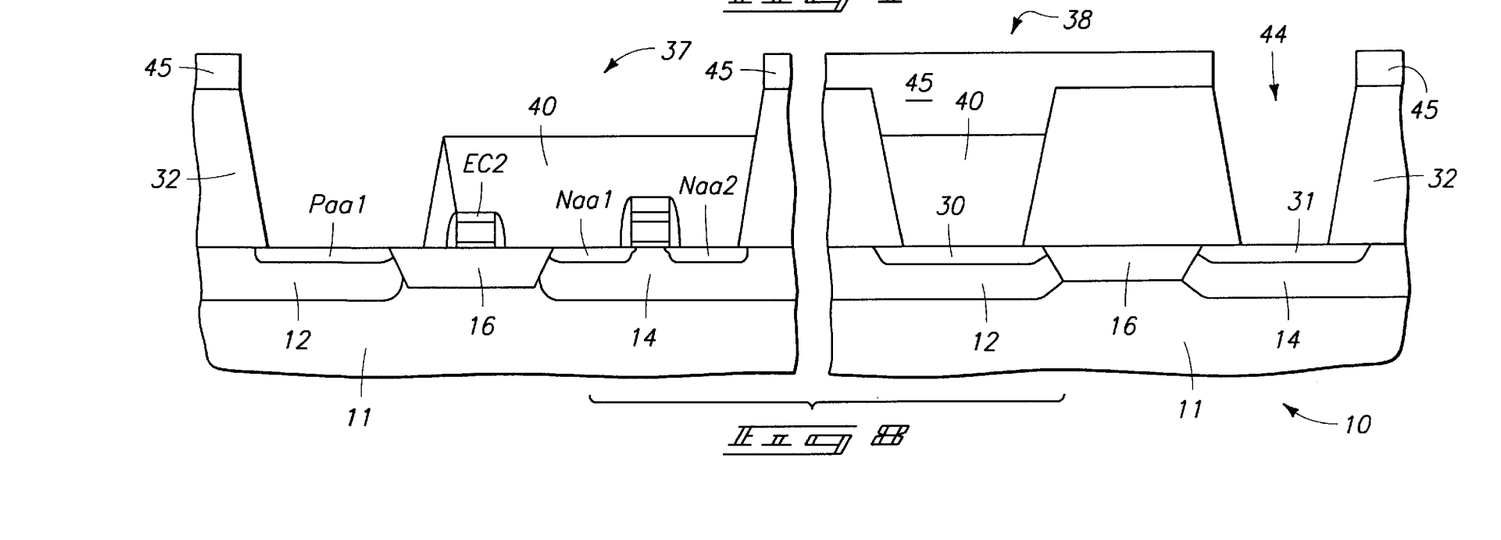
FIG. 8 is a view of the FIG. 3 wafer fragment at a processing step subsequent to that depicted by FIG. 7.

Referring to FIG. 8, and in a second common masking step, a second local interconnect opening 37 is formed into insulative layer 32 to node Paa1, and second contact openings 44 to peripheral circuitry second conductivity type nodes 31 are formed. The preferred method for conducting the same is by the illustrated exemplary photoresist layer 45 deposition and patterning to form the illustrated opening therethrough, followed by anisotropic etching to form the depicted openings 37 and 44. Second local interconnect opening 37 overlaps with first local interconnect opening 36, with first interconnect opening 38 and second interconnect opening 37 together defining the total outline LI2 of the local interconnect being fabricated.

Figure 9:
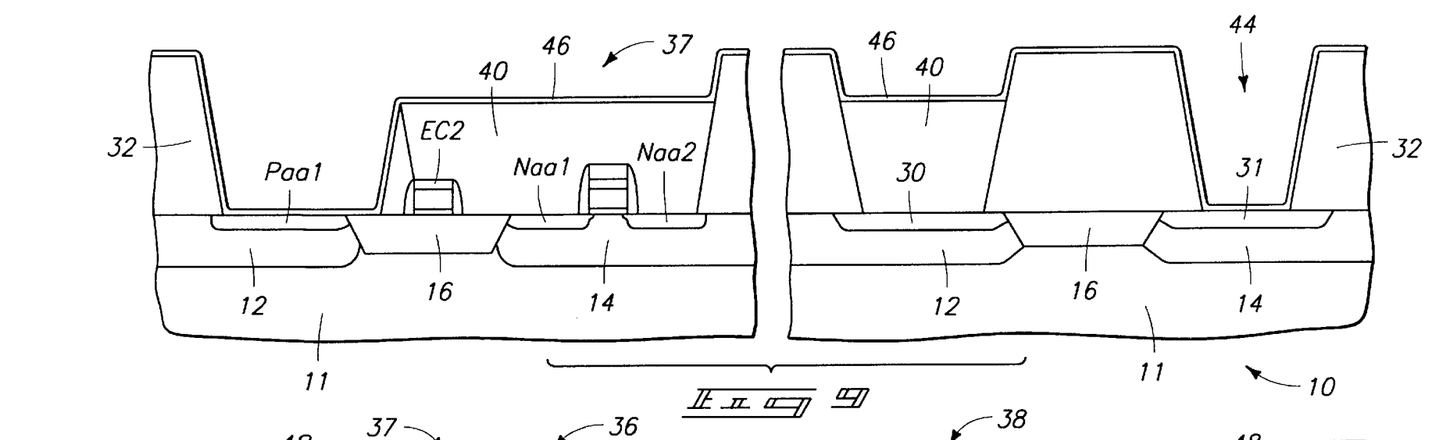
FIG. 9 is a view of the FIG. 3 wafer fragment at a processing step subsequent to that depicted by FIG. 8.

Referring to FIG. 9, the masking layer has been removed and a conductive diffusion barrier material 46 is formed over (preferably "on" or contacting as shown) and in electrical connection with first conductivity type semiconductive material 40 received within first local interconnect opening 36 and within peripheral circuitry first contact openings 38. Further in the depicted embodiment, conductive diffusion barrier material 46 is received within second local interconnect opening 37 in electrical connection with node Paa1 and within peripheral circuitry second contact openings 44 in electrical connection with peripheral circuitry second conductivity type nodes 31. Example and preferred conductive diffusion barrier materials include metals and metal compounds, such as titanium and titanium nitride alone or in combination, deposited to an exemplary thickness range of from about 100 Angstroms to about 400 Angstroms. By way of alternate example only, other possible materials include WN, TiSi$_x$ and CoSi$_x$. Alternately, but less preferred, conductive diffusion barrier material 46 could be deposited immediately after the processing depicted by FIG. 7.

Figure 10:
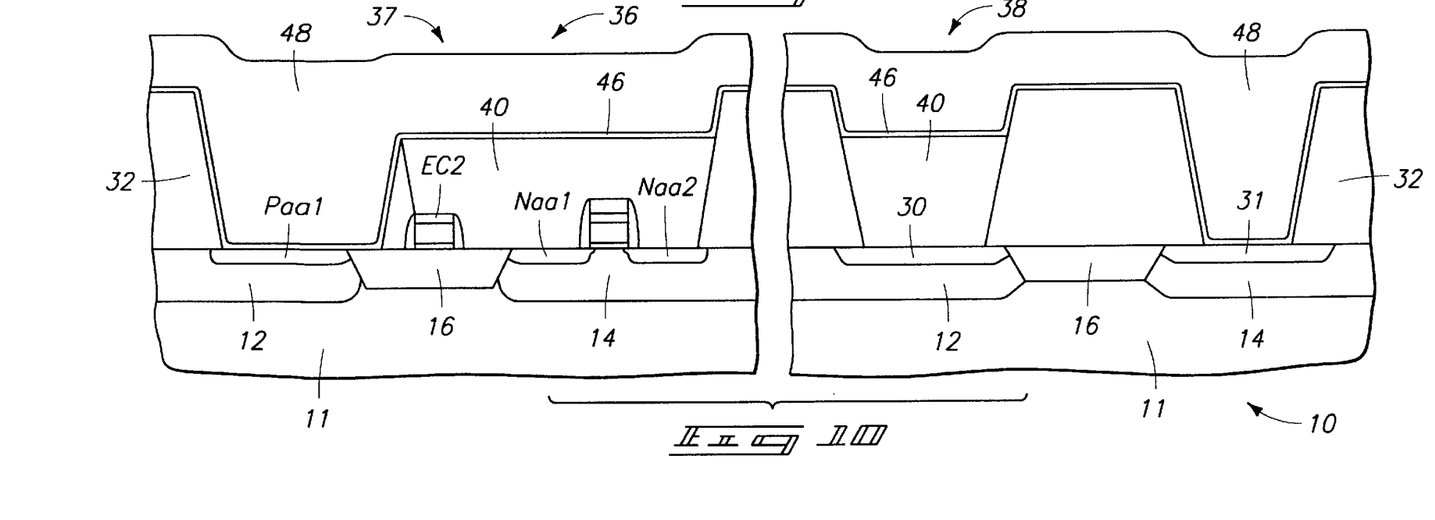
FIG. 10 is a view of the FIG. 3 wafer fragment at a processing step subsequent to that depicted by FIG. 9.

Referring to FIG. 10, a second conductivity type semiconductive material 48 is formed within second local interconnect opening 37 and within peripheral circuitry first contact openings 38 over and in electrical connection with the respective first conductivity type semiconductive material 40 received therewithin through conductive diffusion barrier material 46, and within peripheral circuitry second contact openings 44 over an in electrical connection with the respective peripheral circuitry second conductivity type nodes 31 through conductive diffusion barrier material 46. An example and preferred material is p-type conductively doped polysilicon, in conjunction with the illustrated and described embodiment. Preferably in such instance, conductive diffusion barrier material 46 prevents diode formation between regions 48 and 40. In conjunction with some claimed embodiments, material 48 might constitute a second conductive material which is not conductively doped semiconductive material, with various metal and metal compounds being examples. In some such embodiments, conductive diffusion barrier layer 46 can be considered and might simply constitute some third conductive material different from the first and second conductive materials which is provided intermediate therebetween, and independent of diffusion barrier properties and/or diode prevention properties.

Figure 11:
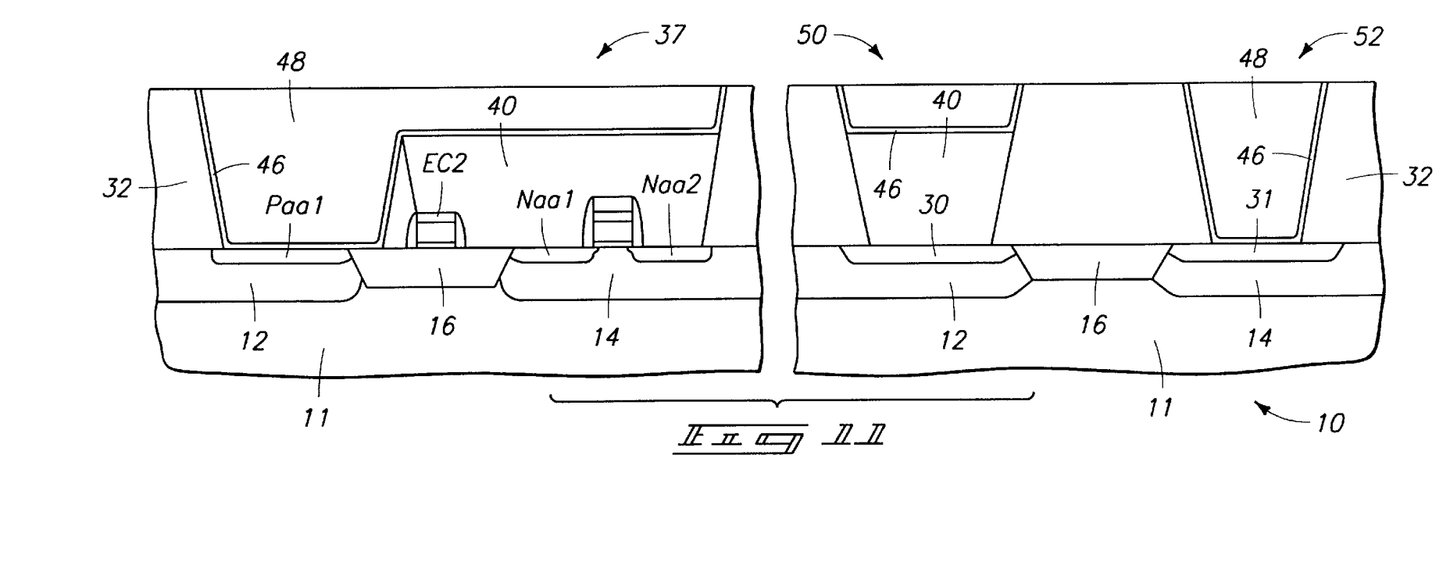
FIG. 11 is a view of the FIG. 3 wafer fragment at a processing step subsequent to that depicted by FIG. 10.

Referring to FIG. 11, layers 48 and 46 are subjected to a suitable planarizing step, such as chemical-mechanical polishing or isotropic etch back, thereby forming the respective conductive materials into a local interconnect LI2 (FIG. 2) and into contact plugs 50 and 52. Thereby, the illustrated conductive materials are isolated from one another, at least in the illustrated cross section. Rapid thermal annealing is then preferably conducted, as is conventional. Such provides but one example of forming the various materials into a local interconnect LI2 and includes in only the preferred embodiment forming the first and second conductive materials, preferably first and second type semiconductive materials, within insulative material openings which collectively define a total outline of the local interconnect being fabricated. The invention also contemplates fabrication of contact plugs independent of local interconnect fabrication.

The preferred embodiment depiction with respect to SRAM circuitry local interconnect fabrication is with respect to a six transistor SRAM cell, although other SRAM cells are contemplated, as well as any local interconnect independent of SRAM circuitry.

Figure 12:
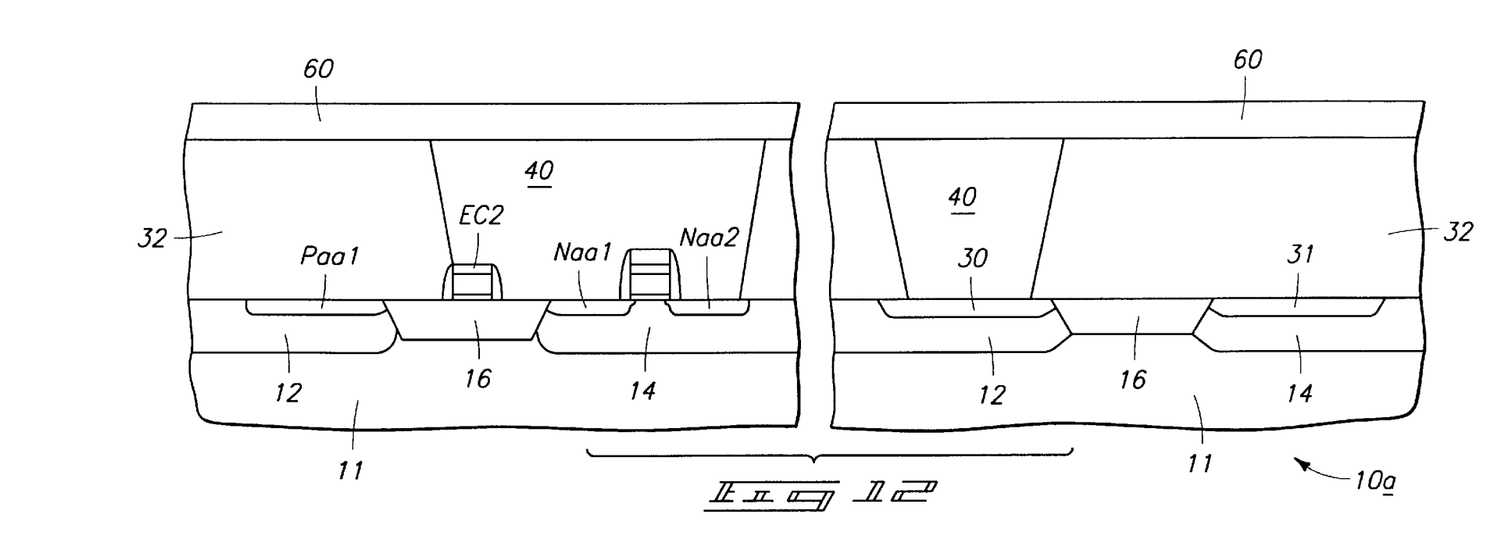
FIG. 12 is a view of the FIG. 3 wafer fragment at an alternate processing step to that depicted by FIG. 7.

By way of example only, FIGS. 12 and 13 illustrate exemplary alternate preferred processing occurring starting immediately subsequently to that depicted by FIG. 6. FIG. 7 illustrates preferred recess etching of first conductivity type semiconductive material 40 within the respective openings. FIG. 12 alternately depicts an exemplary embodiment 10a. Like numerals from the first embodiment are utilized where appropriate, with differences being indicated by the suffix "a" or with different numerals. An insulative layer 60 is formed over the substrate, for example BPSG, as shown in FIG. 12.

Referring to FIG. 13, insulative layer 60 has been patterned to 8 form second local interconnect opening 37a and second contact openings 44a therethrough, and through lower insulative layer 32. Such provides in the preferred embodiment, an alternate effective way of providing a recess of first type semiconductive material 40 relative to an outer surface of an insulative layer. Alternately, of course, processing might occur without any effective recessing, with the invention only being limited by the accompanying claims appropriately interpreted with the doctrine of equivalents.

The invention also contemplates local interconnects, including SRAM local interconnects and other integrated circuitry independent of the method of fabrication, whether disclosed herein, existing in the present state of the art, or yet-to-be developed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a local interconnect comprising:
   providing a substrate having a gate of a first transistor and a source/drain region of a second transistor;
   forming a first conductivity type semiconductive material over and in electrical connection with the first transistor gate;
   forming a conductive diffusion barrier material over and in electrical connection with the first conductivity type semiconductive material;
   forming a second conductivity type semiconductive material over and in electrical connection with the first conductivity type semiconductive material through the conductive diffusion barrier material, and over and in electrical connection with the source/drain region; and
   forming the first conductivity type semiconductive material, the conductive diffusion barrier material and the second conductivity type semiconductive material into a local interconnect electrically connecting the first transistor gate with the source/drain region.

2. The method of claim 1 wherein the first transistor gate and the second transistor source/drain region are part of an SRAM cell.

3. The method of claim 1 comprising forming the conductive diffusion barrier material over and in electrical connection with the source/drain region prior to the forming of the second conductivity type semiconductive material.

4. The method of claim 1 comprising forming the first and second conductivity type semiconductive materials within insulative material openings which collectively define a total outline of the local interconnect being fabricated.

5. A method of forming a local interconnect comprising:
providing a substrate having at least first, second, and third nodes to be electrically connected, at least the first and third nodes being of different conductivity type;
forming a first conductivity type semiconductive material over and in electrical connection with the first and second nodes;
forming a conductive diffusion barrier material over and in electrical connection with the first conductivity type semiconductive material;
forming a second conductivity type semiconductive material over and in electrical connection with the first conductivity type semiconductive material through the conductive diffusion barrier material, and over and in electrical connection with the third node; and
forming the first conductivity type semiconductive material, the conductive diffusion barrier material and the second conductivity type semiconductive material into a local interconnect electrically connecting the first, second and third nodes.

6. The method of claim 5 comprising forming the conductive diffusion barrier material over and in electrical connection with the third node prior to the forming of the second conductivity type semiconductive material.

7. The method of claim 5 comprising forming the first and second conductivity type semiconductive materials within insulative material openings which collectively define a total outline of the local interconnect being fabricated.

8. A method of forming a local interconnect sequentially comprising:
providing a substrate having at least first, second and third nodes to be electrically connected;
providing an insulative layer over the substrate;
forming a first opening into the insulative layer to the first and second nodes, the first opening comprising an outline which forms only a portion of a total outline of the local interconnect being fabricated;
forming first conductive material within the first opening in electrical connection with the first and second nodes;
forming a second opening into the insulative layer to the third node and over at least a portion of the first conductive material formed within the first opening, the first and second openings together defining the total outline of the local interconnect being fabricated; and
forming second conductive material, different from the first conductive material, within the second opening over and in electrical connection with the first conductive material, and over and in electrical connection with the third node; and forming the first conductive material and the second conductive material into a local interconnect electrically connecting the first, second and third nodes.

9. The method of claim 8 wherein at least one of the first and second conductive materials is conductively doped semiconductive material.

10. The method of claim 8 comprising providing a third conductive material, different from the first and second conductive materials, intermediate the first and second conductive materials.

11. The method of claim 8 comprising providing a third conductive material, different from the first and second conductive materials, intermediate the first and second conductive materials, and intermediate the third node and the second conductive material.

12. A method of forming a local interconnect comprising:
providing a substrate having at least first, second and third nodes to be electrically connected;
providing an insulative layer over the substrate;
forming a first opening into the insulative layer to the first and second nodes, the first opening comprising an outline which forms only a portion of a total outline of the local interconnect being fabricated;
forming first conductive material within the first opening in electrical connection with the first and second nodes;
forming a second opening into the insulative layer to the third node and over at least a portion of the first conductive material formed within the first opening, the first and second openings together defining the total outline of the local interconnect being fabricated;
forming second conductive material, different from the first conductive material, within the second opening over and in electrical connection with the first conductive material, and over and in electrical connection with the third node; and
comprising recessing the first conductive material within the first opening prior to forming the second conductive material.

13. The method of claim 12 comprising forming the first conductive material and the second conductive material into a local interconnect electrically connecting the first, second and third nodes.

14. A method of forming a local interconnect comprising:
providing a substrate having at least first, second and third nodes to be electrically connected;
providing an insulative layer over the substrate;
forming a first opening into the insulative layer to the first and second nodes, the first opening comprising an outline which forms only a portion of a total outline of the local interconnect being fabricated;
forming first conductive material within the first opening in electrical connection with the first and second nodes;
forming a second opening into the insulative layer to the third node and over at least a portion of the first conductive material formed within the first opening, the first and second openings together defining the total outline of the local interconnect being fabricated;
forming second conductive material, different from the first conductive material, within the second opening over and in electrical connection with the first conductive material, and over and in electrical connection with the third node; and
comprising recess etching the first conductive material within the first opening prior to forming the second conductive material.

15. The method of claim 14 comprising forming the first conductive material and the second conductive material into a local interconnect electrically connecting the first, second and third nodes.

16. A method of forming a local interconnect comprising:
providing a substrate having at least first, second and third nodes to be electrically connected;
providing an insulative layer over the substrate;
forming a first opening into the insulative layer to the first and second nodes, the first opening comprising an outline which forms only a portion of a total outline of the local interconnect being fabricated;
forming first conductive material within the first opening in electrical connection with the first and second nodes;

forming a second opening into the insulative layer to the third node and over at least a portion of the first conductive material formed within the first opening, the first and second openings together defining the total outline of the local interconnect being fabricated;

forming second conductive material, different from the first conductive material, within the second opening over and in electrical connection with the first conductive material, and over and in electrical connection with the third node; and comprising recess etching the first conductive material within the first opening prior to forming the second conductive material; and forming a third conductive material, different from the first and second conductive materials, over the recessed first material and within the first opening prior to forming the second conductive material.

17. The method of claim 16 comprising forming the first conductive material and the second conductive material into a local interconnect electrically connecting the first, second and third nodes.

18. A method of forming a local interconnect comprising:

providing a substrate having at least first, second and third nodes to be electrically connected;

providing an insulative layer over the substrate;

forming a first opening into the insulative layer to the first and second nodes, the first opening comprising an outline which forms only a portion of a total outline of the local interconnect being fabricated;

forming first conductive material within the first opening in electrical connection with the first and second nodes;

forming a second opening into the insulative layer to the third node and over at least a portion of the first conductive material formed within the first opening, the first and second openings together defining the total outline of the local interconnect being fabricated;

forming second conductive material, different from the first conductive material, within the second opening over and in electrical connection with the first conductive material, and over and in electrical connection with the third node; and comprising after forming the first conductive material, forming another insulative layer over the substrate and forming the second opening to extend through the another insulative layer.

19. The method of claim 18 comprising forming the first conductive material and the second conductive material into a local interconnect electrically connecting the first, second and third nodes.

20. A method of forming a local interconnect sequentially comprising:

providing a substrate having at least first, second and third nodes to be electrically connected;

providing an insulative layer over the substrate;

forming a first opening into the insulative layer to the first and second nodes, the first opening comprising an outline which forms only a portion of a total outline of the local interconnect being fabricated;

forming a first conductivity type semiconductive material within the first opening in electrical connection with the first and second nodes;

forming a second opening into the insulative layer to the third node and over at least a portion of the first conductivity type semiconductive material formed within the first opening, the first and second openings together defining the total outline of the local interconnect being fabricated;

forming a conductive diffusion barrier material over and in electrical connection with the first conductivity type semiconductive material; and forming a second conductivity type semiconductive material within the second opening over and in electrical connection with the first conductivity type semiconductive material through the conductive diffusion barrier material, and over and in electrical connection with the third node; and forming the first conductivity type semiconductive material, the second conductivity type semiconductive material and the conductive diffusion barrier material into a local interconnect electrically connecting the first, second and third nodes.

21. The method of claim 20 comprising forming the conductive diffusion barrier material over and in electrical connection with the third node prior to the forming of the second conductivity type semiconductive material.

22. A method of forming a local interconnect comprising:

providing a substrate having at least first, second and third nodes to be electrically connected;

providing an insulative layer over the substrate;

forming a first opening into the insulative layer to the first and second nodes, the first opening comprising an outline which forms only a portion of a total outline of the local interconnect being fabricated;

forming a first conductivity type semiconductive material within the first opening in electrical connection with the first and second nodes;

forming a second opening into the insulative layer to the third node and over at least a portion of the first conductivity type semiconductive material formed within the first opening, the first and second openings together defining the total outline of the local interconnect being fabricated;

forming a conductive diffusion barrier material over and in electrical connection with the first conductivity type semiconductive material;

forming a second conductivity type semiconductive material within the second opening over and in electrical connection with the first conductivity type semiconductive material through the conductive diffusion barrier material, and over and in electrical connection with the third node; and comprising recessing the first conductivity type semiconductive material within the first opening prior to forming the second conductivity type semiconductive material.

23. The method of claim 22 forming the first conductivity type semiconductive material, the second conductivity type semiconductive material and the conductive diffusion barrier material into a local interconnect electrically connecting the first, second and third nodes.

24. A method of forming a local interconnect comprising:

providing a substrate having at least first, second and third nodes to be electrically connected;

providing an insulative layer over the substrate;

forming a first opening into the insulative layer to the first and second nodes, the first opening comprising an outline which forms only a portion of a total outline of the local interconnect being fabricated;

forming a first conductivity type semiconductive material within the first opening in electrical connection with the first and second nodes;

forming a second opening into the insulative layer to the third node and over at least a portion of the first conductivity type semiconductive material formed within the first opening, the first and second openings together defining the total outline of the local interconnect being fabricated;

forming a conductive diffusion barrier material over and in electrical connection with the first conductivity type semiconductive material;

forming a second conductivity type semiconductive material within the second opening over and in electrical connection with the first conductivity type semiconductive material through the conductive diffusion barrier material, and over and in electrical connection with the third node; and comprising recess etching the first conductivity type semiconductive material within the first opening prior to forming the second conductivity type semiconductive material.

25. The method of claim 24 forming the first conductivity type semiconductive material, the second conductivity type semiconductive material and the conductive diffusion barrier material into a local interconnect electrically connecting the first, second and third nodes.

26. A method of forming a local interconnect comprising:

providing a substrate having at least first, second and third nodes to be electrically connected;

providing an insulative layer over the substrate;

forming a first opening into the insulative layer to the first and second nodes, the first opening comprising an outline which forms only a portion of a total outline of the local interconnect being fabricated;

forming a first conductivity type semiconductive material within the first opening in electrical connection with the first and second nodes;

forming a second opening into the insulative layer to the third node and over at least a portion of the first conductivity type semiconductive material formed within the first opening, the first and second openings together defining the total outline of the local interconnect being fabricated;

forming a conductive diffusion barrier material over and in electrical connection with the first conductivity type semiconductive material;

forming a second conductivity type semiconductive material within the second opening over and in electrical connection with the first conductivity type semiconductive material through the conductive diffusion barrier material, and over and in electrical connection with the third node; and comprising after forming the first conductivity type semiconductive material, forming another insulative layer over the substrate and forming the second opening to extend through the another insulative layer.

27. The method of claim 26 forming the first conductivity type semiconductive material, the second conductivity type semiconductive material and the conductive diffusion barrier material into a local interconnect electrically connecting the first, second and third nodes.

28. A method of fabricating integrated circuitry comprising an SRAM cell having a local interconnect and having circuitry peripheral to the SRAM cell, the method sequentially comprising:

providing a substrate having at least first, second and third nodes of an SRAM cell to be electrically connected, and having a plurality of peripheral circuitry first conductivity type nodes and a plurality of peripheral circuitry second conductivity type nodes, the first node being a source/drain region of the first conductivity type of a first transistor of the SRAM cell, the second node being a gate of a second transistor of the SRAM cell, the third node being a source/drain region of the second conductivity type of a third transistor of the SRAM cell;

providing an insulative layer over the substrate;

in a first common masking step, forming a first local interconnect opening into the insulative layer to the first and second nodes and forming first contact openings to the peripheral circuitry first conductivity type nodes, the first local interconnect opening comprising an outline which forms only a portion of a total outline of the local interconnect being fabricated;

forming first conductivity type semiconductive material within the first local interconnect opening in electrical connection with the first and second nodes and within the peripheral circuitry first contact openings in electrical connection with the peripheral circuitry first conductivity type nodes;

in a second common masking step, forming a second local interconnect opening into the insulative layer to the third node and forming second contact openings to the peripheral circuitry second conductivity type nodes, the second local interconnect opening overlapping with the first local interconnect opening, with the first and second local interconnect openings together defining the total outline of the local interconnect being fabricated;

forming a conductive diffusion barrier material over and in electrical connection with the first conductivity type semiconductive material received within the first local interconnect opening and within the peripheral circuitry first contact openings, and within the second local interconnect opening in electrical connection with the third node, and within the peripheral circuitry second contact openings in electrical connection with the peripheral circuitry second conductivity type nodes; and forming second conductivity type semiconductive material within the second local interconnect opening and within the peripheral circuitry first contact openings over and in electrical connection with the respective first conductivity type semiconductive material received therewithin through the conductive diffusion barrier material, and within the peripheral circuitry second contact openings over and in electrical connection with the respective peripheral circuitry second conductivity type nodes through the conductive diffusion barrier material; and forming the first conductivity type semiconductive material, the second conductivity type semiconductive material and the conductive diffusion barrier material into a local interconnect electrically connecting the first, second and third nodes.

29. The method of claim 28 wherein the SRAM cell is a six transistor SRAM cell.

30. A method of fabricating integrated circuitry comprising an SRAM cell having a local interconnect and having circuitry peripheral to the SRAM cell, the method comprising:

providing a substrate having at least first, second and third nodes of an SRAM cell to be electrically connected, and having a plurality of peripheral circuitry first conductivity type nodes and a plurality of peripheral circuitry second conductivity type nodes, the first node being a source/drain region of the first conductivity type of a first transistor of the SRAM cell, the second node being a gate of a second transistor of the SRAM cell, the third node being a source/drain region of the second conductivity type of a third transistor of the SRAM cell;

providing an insulative layer over the substrate;

in a first common masking step, forming a first local interconnect opening into the insulative layer to the first and second nodes and forming first contact openings to the peripheral circuitry first conductivity type nodes, the first local interconnect opening comprising an outline which forms only a portion of a total outline of the local interconnect being fabricated;

forming first conductivity type semiconductive material within the first local interconnect opening in electrical connection with the first and second nodes and within the peripheral circuitry first contact openings in electrical connection with the peripheral circuitry first conductivity type nodes;

in a second common masking step, forming a second local interconnect opening into the insulative layer to the third node and forming second contact openings to the peripheral circuitry second conductivity type nodes, the second local interconnect opening overlapping with the first local interconnect opening, with the first and second local interconnect openings together defining the total outline of the local interconnect being fabricated;

forming a conductive diffusion barrier material over and in electrical connection with the first conductivity type semiconductive material received within the first local interconnect opening and within the peripheral circuitry first contact openings, and within the second local interconnect opening in electrical connection with the third node, and within the peripheral circuitry second contact openings in electrical connection with the peripheral circuitry second conductivity type nodes;

forming second conductivity type semiconductive material within the second local interconnect opening and within the peripheral circuitry first contact openings over and in electrical connection with the respective first conductivity type semiconductive material received therewithin through the conductive diffusion barrier material, and within the peripheral circuitry second contact openings over and in electrical connection with the respective peripheral circuitry second conductivity type nodes through the conductive diffusion barrier material; and comprising recessing the first conductivity type semiconductive material within the first local interconnect opening and within the peripheral circuitry contact openings prior to forming the conductive diffusion barrier material.

31. The method of claim 30 forming the first conductivity type semiconductive material, the second conductivity type semiconductive material and the conductive diffusion barrier material into a local interconnect electrically connecting the first, second and third nodes.

32. A method of fabricating integrated circuitry comprising an SRAM cell having a local interconnect and having circuitry peripheral to the SRAM cell, the method comprising:

providing a substrate having at least first, second and third nodes of an SRAM cell to be electrically connected, and having a plurality of peripheral circuitry first conductivity type nodes and a plurality of peripheral circuitry second conductivity type nodes, the first node being a source/drain region of the first conductivity type of a first transistor of the SRAM cell, the second node being a gate of a second transistor of the SRAM cell, the third node being a source/drain region of the second conductivity type of a third transistor of the SRAM cell;

providing an insulative layer over the substrate;

in a first common masking step, forming a first local interconnect opening into the insulative layer to the first and second nodes and forming first contact openings to the peripheral circuitry first conductivity type nodes, the first local interconnect opening comprising an outline which forms only a portion of a total outline of the local interconnect being fabricated;

forming first conductivity type semiconductive material within the first local interconnect opening in electrical connection with the first and second nodes and within the peripheral circuitry first contact openings in electrical connection with the peripheral circuitry first conductivity type nodes;

in a second common masking step, forming a second local interconnect opening into the insulative layer to the third node and forming second contact openings to the peripheral circuitry second conductivity type nodes, the second local interconnect opening overlapping with the first local interconnect opening, with the first and second local interconnect openings together defining the total outline of the local interconnect being fabricated;

forming a conductive diffusion barrier material over and in electrical connection with the first conductivity type semiconductive material received within the first local interconnect opening and within the peripheral circuitry first contact openings, and within the second local interconnect opening in electrical connection with the third node, and within the peripheral circuitry second contact openings in electrical connection with the peripheral circuitry second conductivity type nodes;

forming second conductivity type semiconductive material within the second local interconnect opening and within the peripheral circuitry first contact openings over and in electrical connection with the respective first conductivity type semiconductive material received therewithin through the conductive diffusion barrier material, and within the peripheral circuitry second contact openings over and in electrical connection with the respective peripheral circuitry second conductivity type nodes through the conductive diffusion barrier material; and comprising recess etching the first conductivity type semiconductive material within the first local interconnect opening and within the peripheral circuitry contact openings prior to forming the conductive diffusion barrier material.

33. The method of claim 32 forming the first conductivity type semiconductive material, the second conductivity type semiconductive material and the conductive diffusion barrier material into a local interconnect electrically connecting the first, second and third nodes.

34. A method of forming contact plugs comprising:

providing a substrate having a plurality of first conductivity type nodes and a plurality of second conductivity type nodes;

providing an insulative layer over the substrate;

forming first contact openings through the insulative layer to the first conductivity type nodes;

forming a first conductivity type semiconductive material within the first contact openings in electrical connection with the first conductivity type nodes;

forming second contact openings through the insulative layer to the second conductivity type nodes;

forming a conductive diffusion barrier material within the second contact openings in electrical connection with the second conductivity type nodes and in electrical connection with the first conductivity type semiconductive material received within the first contact openings;

forming a second conductivity type semiconductive material within the second contact openings in electrical connection with the second conductivity type nodes through the conductive diffusion barrier material, and over and in electrical connection with the first conductivity type semiconductive material through the conductive diffusion barrier material within the first contact openings over the first conductivity type nodes; and comprising recessing the first conductivity type semiconductive material within the first contact openings prior to forming the conductive diffusion barrier material.

35. A method of forming contact plugs comprising:

providing a substrate having a plurality of first conductivity type nodes and a plurality of second conductivity type nodes;

providing an insulative layer over the substrate;

forming first contact openings through the insulative layer to the first conductivity type nodes;

forming a first conductivity type semiconductive material within the first contact openings in electrical connection with the first conductivity type nodes;

forming second contact openings through the insulative layer to the second conductivity type nodes;

forming a conductive diffusion barrier material within the second contact openings in electrical connection with the second conductivity type nodes and in electrical connection with the first conductivity type semiconductive material received within the first contact openings;

forming a second conductivity type semiconductive material within the second contact openings in electrical connection with the second conductivity type nodes through the conductive diffusion barrier material, and over and in electrical connection with the first conductivity type semiconductive material through the conductive diffusion barrier material within the first contact openings over the first conductivity type nodes; and comprising recess etching the first conductivity type semiconductive material within the first contact openings prior to forming the conductive diffusion barrier material.

* * * * *

UNITED STATES PATENT AND TRADEMARK OFFICE
CERTIFICATE OF CORRECTION

PATENT NO.     : 6,333,254 B1
DATED          : December 25, 2001
INVENTOR(S)    : Todd R. Abbott et al.

It is certified that error appears in the above-identified patent and that said Letters Patent is hereby corrected as shown below:

<u>Column 6,</u>
Line 15, replace "to 8 form second" with -- to form second --

Signed and Sealed this

Fourteenth Day of May, 2002

*Attest:*

*Attesting Officer*

JAMES E. ROGAN
*Director of the United States Patent and Trademark Office*